(12) United States Patent
Quemere et al.

(10) Patent No.: US 10,921,269 B2
(45) Date of Patent: Feb. 16, 2021

(54) METHOD FOR CHARACTERISATION BY CD-SEM SCANNING ELECTRONIC MICROSCOPY

(71) Applicant: COMMISSARIAT A L'ENERGIE ATOMIQUE ET AUX ENERGIES ALTERNATIVES, Paris (FR)

(72) Inventors: Patrick Quemere, Voreppe (FR); Jérôme Hazart, Eybens (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/469,956

(22) PCT Filed: Dec. 12, 2017

(86) PCT No.: PCT/EP2017/082429
§ 371 (c)(1),
(2) Date: Jun. 14, 2019

(87) PCT Pub. No.: WO2018/108914
PCT Pub. Date: Jun. 21, 2018

(65) Prior Publication Data
US 2020/0088658 A1  Mar. 19, 2020

(30) Foreign Application Priority Data

Dec. 15, 2016 (FR) ..................................... 16 62505

(51) Int. Cl.
*G01N 23/2251* (2018.01)

(52) U.S. Cl.
CPC ..... *G01N 23/2251* (2013.01); *G01N 2223/401* (2013.01); *G01N 2223/418* (2013.01); *G01N 2223/611* (2013.01)

(58) Field of Classification Search
USPC ......................................... 250/307, 306, 310
See application file for complete search history.

(56) References Cited

U.S. PATENT DOCUMENTS 5,591,971 A * 1/1997 Shahar et al. ........ H01J 37/256
250/310

OTHER PUBLICATIONS

International Search Report as issued in International Patent Application No. PCT/EP2017/082429, dated Mar. 19, 2018.

(Continued)

*Primary Examiner* — Kiet T Nguyen
(74) *Attorney, Agent, or Firm* — Pillsbury Winthrop Shaw Pittman LLP

(57) ABSTRACT

A method for implementing a scanning electron microscopy characterisation technique for the determination of at least one critical dimension of the structure of a sample in the field of dimensional metrology, known as CD-SEM technique, includes producing an experimental image; from a first theoretical model based on parametric mathematical functions, calculating a second theoretical model $U(P_i,t_i)$ describing the signal measured at the position $P_i$ at the instant $t_i$, the second model $U(P_i,t_i)$ being obtained by algebraic summation of a corrective term $S(P_i,t_i)$; determining the set of parameters present in the second theoretical model; wherein the corrective term $S(P_i,t_i)$ is calculated by summing the signal coming from the electric charges deposited by the primary electron beam at a plurality of instants t less than or equal to $t_i$.

11 Claims, 4 Drawing Sheets

(56) References Cited

OTHER PUBLICATIONS

Babin, S., et al., "Fast analytical modeling of SEM images at a high level of accuracy," Optomechatronic Micro/Nano Devices and Components III, vol. 9424, Mar. 2015, XP060051658, 10 pages.
Mack, C. A., et al. "Improvements to the Analytical Linescan Model for SEM Metrology," SPIE—International Society for Optical Engineering, vol. 9778, Mar. 2016, XP060065251, 10 pages.
Frase, C. G., et al., "CD characterization of nanostructures in SEM metrology," Institute of Physics Publishing, Meas. Sci. Techol., vol. 18, No. 2, Feb. 2007, XP020118520, pp. 510-519.
Levi, S., et al. "SEM Simulation for 2D and 3D Inspection Metrology and Defect Review," Optomechatronic Micro/Nano Devices and Components III, vol. 9051, Mar. 2014, XP060031041, 10 pages.

\* cited by examiner

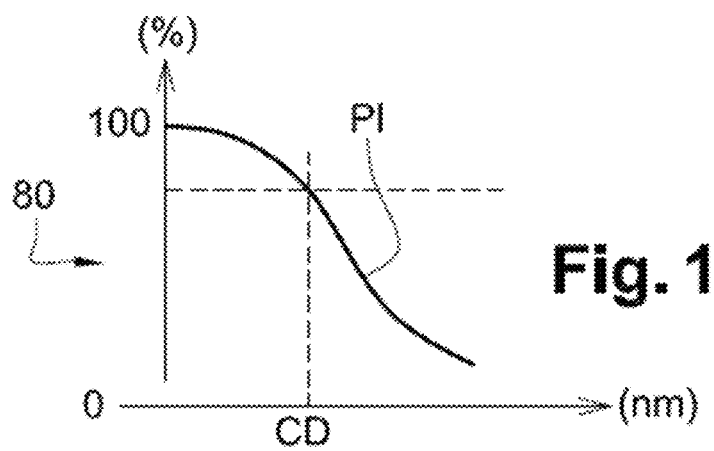
Fig. 1
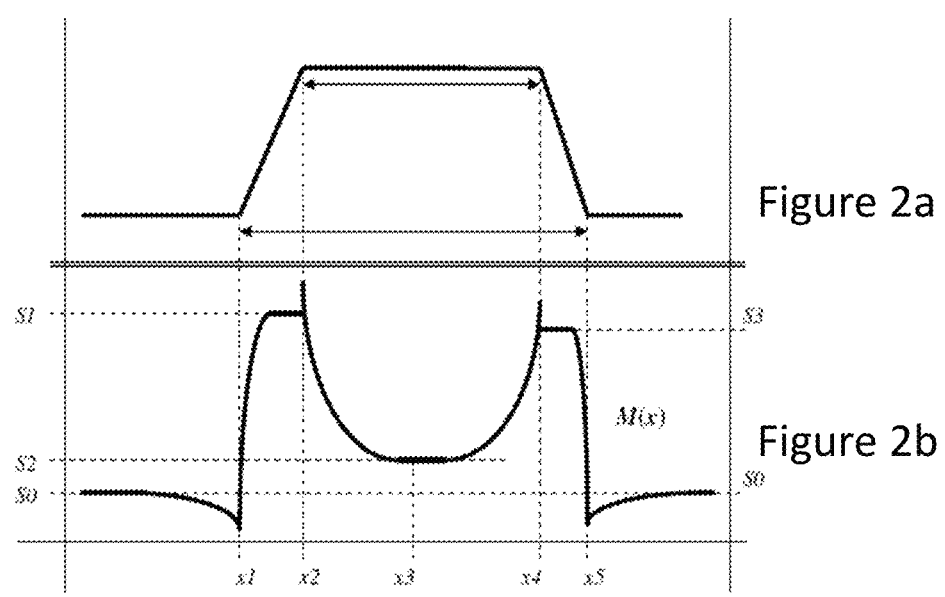
Figure 2a
Figure 2b

METHOD FOR CHARACTERISATION BY CD-SEM SCANNING ELECTRONIC MICROSCOPY

CROSS REFERENCE TO RELATED APPLICATIONS

This application is the U.S. National Stage of PCT/EP2017/082429, filed Dec. 12, 2017, which in turn claims priority to French Patent Application No. 1662505 filed Dec. 15, 2016, the entire contents of all applications are incorporated herein by reference in their entireties.

FIELD OF THE INVENTION

The field of the invention relates to a method for implementing a scanning electron microscopy (SEM) characterisation technique. To this end, the invention pertains to applications in dimensional metrology notably for the semiconductor industry. The field of the invention also relates to the determination of a critical dimension (Critical Dimension Scanning Electron Microscopy or CD-SEM) of the topography of a sample of semiconductors, for example a printed circuit in microelectronics

PRIOR ART

The characterisation of structures of micrometric or nanometric size is today of vital importance in the semiconductor industry, notably in microelectronics, and more generally in the nanotechnologies field. If the case of microelectronics is considered, the precise and reliable measurement of the characteristic dimensions of nanostructures is necessary throughout the different steps of the production process, from the research and development phase up to the production phase. In addition, the miniaturisation of microelectronic components requires ever more efficient characterisation tools.

The semiconductors industry defines the size of its products in terms of a characteristic size called critical dimension (CD). Critical dimension is taken to mean the critical dimension or dimensions of a pattern representing one or more characteristic lengths of the pattern which prove to be critical either for the control of the manufacturing method or to guarantee the electrical performances of the final electronic device constituted of said patterns. The reliable measurement of this critical dimension is today one of the main issues for scanning electron microscopy.

During the acquisition of an image by scanning electron microscopy, an electron beam, known as primary electron beam, scans the surface of a sample of interest. Each point of the surface is identified by a pair of spatial coordinates called (x,y) hereafter. Collisions between primary electrons and atoms of the sample produce several physical phenomena which may be very complex. Among these phenomena there is the emission of secondary electrons and the emission of backscattered electrons. These electrons are captured by selective detectors near to the sample. Scanning the sample point by point results in the formation of an electronic image reflecting the different shapes and different materials of the sample. Hereafter, reference will be made to the different shapes of the sample and their different materials as to the structure of the sample.

The SEM image thereby obtained is a grey level image and the geometric measurements of the objects are determined by an analysis of the contours of the objects obtained after the choice of one or more thresholds. It is possible for example to reconstruct a graph as illustrated in FIG. 1 representing an intensity profile of secondary electrons PI comprising on the y-axis a percentage of collected secondary electrons and on the x-axis a dimension in nm representative of the scanning position. But one of the major problems is the interpretation of the images by thresholding algorithms: it is in fact the choice of this threshold that is going to determine the value of the characteristic size, or critical dimension, of interest. Yet the choice of the threshold is often arbitrary and the optimal choice is different for each object, notably as a function of the height of the patterns, the materials considered, the dimensions of the objects, the density of patterns, etc. Other types of algorithms are based not directly on the grey level but on the analysis of the shape of the intensity peaks and the choice of a threshold relative to the amplitude of the peaks. Here again, the choice of the threshold relative to the analysis of the peak is empirical. At present it is known that CD-SEM techniques give not very reliable measurements for objects of size less than 100 nm (difference to reality from a nanometre to several nanometres). A fixed empirical threshold applied to any type of pattern is all the less satisfactory as there is no direct physical link between the percentage of collected secondary electrons and the real height of the pattern at which it is sought to determine the critical dimension. In other words, if a measurement at 80% of secondary electrons is carried out, that does not mean that a critical dimension is measured at 80% of the height of the pattern. An analysis of SEM images with a thresholding algorithm may thus very readily distort the measurements of critical dimensions.

To overcome this problem, two approaches have been considered. The first is based on Monte Carlo type physical simulations. The implementation of this method requires the simulation of the physical processes of interaction between the primary electrons of the incident beam on the sample and the sample itself. Performing these very complex simulations requires great computing power and very long execution times. These characteristics make Monte Carlo type physical simulations generally not very accessible and very little suited to the processing of a large number of CD-SEM images. The second solution consists in performing a parametric mathematical modelling of the images; such a solution is notably described in the article "CD characterization of nanostructures in SEM metrology" (C. G. Frase, E. Buhr, and K. Dirscherl, Meas. Sci. Technol., vol. 18, no 2, p. 510, February 2007). An example of such functions is illustrated in FIG. 2b for a pattern having a trapezoidal profile along the direction x, represented in FIG. 2a. These functions may be chosen according to a simple phenomenological model or instead by the analysis of preliminary Monte-Carlo modellings describing the formation of SEM images (more complex and precise but requiring long computing times). According to the example of FIG. 2, the pattern is broken down according to sections along the direction x (here six sections), each section corresponding to a particular shape function. The function M(x) may thereby be broken down as follows (into six functions according to each of the sections):

$$M(x) := \begin{cases} S0 + Ae^{\frac{x-x1}{t0}} & x < x1 \\ S1 - (S1 - S0 - A)e^{\frac{x-x1}{t1}} & x1 \leq x \leq x2 \\ S2 + Ce^{\frac{x-x2}{t2}} & x2 < x \leq x3 \\ S2 + De^{\frac{x-x4}{t3}} & x3 < x < x4 \\ S3 - (S3 - S0 - B)e^{\frac{x-x5}{t4}} & x4 \leq x \leq x5 \\ S0 + Be^{\frac{x5-x}{t5}} & x > x5 \end{cases}$$

Each of the six parametric functions reproduces the height of the profile of the sample as a function of the coordinate x in a certain range of values of x. The model presented above thus comprises a plurality of parameters: $x_1, x_2, x_3, x_4, x_5, S_0, S_1, S_2, S_3, t_0, t_1, t_2, t_3, t_4, t_5, A, B, C, D$. The existence of this set of parameters justifies the designation parametric mathematical function. Often, for applications in dimensional metrology, the most interesting parameters are those relating to the lateral dimensions of the pattern namely: $x_1, x_2, x_4$ and $x_5$.

Another method for parametric modelling of CD-SEM images is described in the article "Analytical Linescan Model for SEM Metrology" (C. A. Mack and B. D. Bunday, Metrology, Inspection and Process Control for Microlithography)(XIX, Proc. SPIE Vol. 9424, 2015). According to this model, the function M(x) may be broken down as follows:

$$M(x) := \begin{cases} S0 \cdot \left(1 - \alpha_f \cdot e^{\frac{x}{\sigma_f}} - \alpha_b \cdot e^{\frac{x}{\sigma_b}}\right) & x < x1 \\ S1 + (S0 \cdot (1 - \alpha_f - \alpha_b) - S1) \cdot e^{\frac{x}{d1}} + \\ (S2 \cdot (1 + \alpha_e - \alpha_v) - S1) \cdot e^{-\frac{(X2-x)}{d2}} & x1 \leq x \leq x2 \\ S2 * \left(1 + \alpha_e \cdot e^{\frac{X2-x}{\sigma_e}} - \alpha_v \cdot e^{\frac{X2-x}{\sigma_v}}\right) & x > x2 \end{cases}$$

In this model the parameters are $S_0, S_1, S_2, \alpha_f, \alpha_b, \alpha_e, \alpha_v, \sigma_f, \sigma_b, \sigma_e, \sigma_v, d_1, d_2, X_2$.

In addition, in order to take account of the size of the primary electron beam, which is not zero, it is advisable to associate with the profile described by M(x) a convolution product including in the model the parameters describing the size and the shape of the beam. Usually, the profile of the primary electron beam is characterised using a Gaussian profile (point spread function or PSF), the parameter $\sigma_{PSF}$ being proportional to the full width at half maximum of the Gaussian. The parametric model thereby modified is calculated using the following formula:

$$M(x) = \int\!\!\int_{-\infty}^{+\infty} e^{-\frac{(x-x')^2}{2\sigma_{PSF}^2}} * M(x')dx'$$

Hereafter, the expression "set of parameters of the theoretical model" will refer to all of the parameters used in the mathematical formulation of the theoretical model. Among these parameters, some are used in the geometric description of the structure of the sample, others describe the instrumental response. A parametric function such as the function M(x) will be called hereafter model profile or parametric profile.

Another type of modelling consists in modelling the probability of emission of a secondary electron as a function of the material and the propagation of these electrons towards the detectors as a function of the angle of the detectors (see publication SEM Simulation for 2D and 3D Inspection Metrology and Defect Review of Shimon Levia, Ishai Schwarzbanda, Sergey Khristoa, Yan Ivanchenkoa, Ofer Adana, PDC Business Group, Applied Materials, Rehovot 76705, Israel).

Simpler or more complex models may be elaborated as a function of the type of sample, the quality of the images, or a priori information on the materials or the profiles.

Once the modelling has terminated, it is necessary to resolve an inverse problem, namely the adjustment of the experimental data to the model by varying the parameters. One of the major limitations of these techniques is in their incapacity to take into account and to reproduce certain artefacts observed on CD-SEM images. This is for example the case of images acquired in so-called raster scan mode. These images show dark marks in the regions of the surface of the sample comprised between two or more neighbouring structures, such as the square or rectangular pads of FIG. 3a. In this figure, the directions x and y are indicated, the direction x being that of scanning and the direction y being perpendicular to the direction x. More specifically, these dark marks may be classified according to two types:

Rather linear marks in dark grey or in black in the extension of the horizontal edges aligned with the scanning direction and indicated by the mark 1 of FIG. 3a;

Surface marks in lighter grey along the patterns, still in the scanning direction and indicated by the mark 2 of FIG. 3a.

These dark marks are artefacts created during the process of forming the image.

It may be remarked that the parametric profiles method only takes account of a modelling of profiles along the direction perpendicular to the edges and is thus not able to reproduce the effects of black trails present in the extension of the edges themselves. It is interesting to note that, as illustrated in FIGS. 3b, 3c and 3d, the presence of the black trails increases when several structures close together are present. More specifically, FIG. 3b shows an isolated square structure. Dark traces are visible on the left and on the right of the structure, indicated by the mark $I_1$, with black trails in the extension of the horizontal edges. FIG. 3c shows an SEM image of three square structures close together and aligned along the horizontal direction. The dark marks, indicated by $I_2$, are more intense than in FIG. 3b. FIG. 3d shows an SEM image of a series of several square structures. The dark mark type artefacts along the scanning direction, indicated by $I_3$, are this time more intense than on the images 3b and 3c. These alterations cannot be described according to a purely local approach like that of parametric profiles.

In addition, the parametric profiles method does not take into account effects linked to the accumulation of electric charges deposited by the primary electron beam during scanning. These excess charges can deviate the electrons measured by the selective detectors near to the sample, which comprises the emergence of artefacts in the experimental images.

Furthermore, the electron charging of the material during exposure to the primary electron beam is not constant over time. On the contrary, the excess charge can decrease over time on account of so-called charge dissipation processes. The temporal dependency of the charging phenomena complicates the processing of the CD-SEM images for the elimination of these artefacts.

Technical Problem

In this context, the aim of the present invention is to improve the exploitation, by means of a parametric CD-SEM technique, of CD-SEM images obtained experimentally, notably by taking into account both the effects of spatial "charging" and those of temporal "charging."

SUMMARY OF THE INVENTION

To this end, the invention relates to a method for implementing a scanning electron microscopy characterisation technique for the determination of at least one critical dimension of the structure of a sample in the field of dimensional metrology, known as CD-SEM technique, said method comprising the following steps:
  producing an experimental image representative of the structure of the sample and derived from a scanning electron microscope;
  from a first theoretical model based on parametric mathematical functions, calculating a second theoretical model $U(P_i,t_i)$ describing the signal measured at the position $P_i$ at the instant $t_i$, said second model $U(P_i,t_i)$ being obtained by algebraic summation of a corrective term $S(P_i,t_i)$, said second theoretical model comprising a set of parameters to be determined;
  determination of the set of parameters present in the second theoretical model by means of an adjustment between said second theoretical model and said experimental image;
  said method being characterised in that said corrective term $S(P_i,t_i)$ is calculated by summing the signal originating from the electric charges deposited by the primary electron beam at a plurality of instants t less than or equal to $t_i$.

Critical dimension is taken to mean the critical dimension(s) of a pattern representing one or more characteristic lengths of the pattern which prove to be critical either for the control of the manufacturing method or to guarantee the electrical performances of the final electronic device constituted of said patterns.

Theoretical model based on parametric mathematical functions is taken to mean a mathematical representation of the structure of the sample, for example by one of the functions M(x) defined previously and described in detail in the articles "CD characterization of nanostructures in SEM metrology" (C. G. Frase, E. Buhr, and K. Dirscherl, Meas. Sci. Technol., vol. 18, no. 2, p. 510, February. 2007) or "Analytical Linescan Model for SEM Metrology" (C. A. Mack and B. D. Bunday, Metrology, Inspection and Process Control for Microlitography XXIX, Proc. SPIE Vol. 9424 2015) or AMAT for example.

Set of parameters present in the second theoretical model is taken to mean all of the parameters used in the mathematical formulation of the second theoretical model. This set of parameters includes both the parameters present in the first theoretical parametric model and the parameters present in the corrective term added during the calculating of the second theoretical model. In this set of parameters there will be certain parameters describing the geometry of the structure of the sample, others describing the instrumental response.

Adjustment between the second theoretical model and the experimental image is taken to mean an iterative calculation method aiming to find the set of parameters that minimises the difference between said model and said experimental image. In practice, this calculation method is for example implemented by computer by choosing one of the algorithms known to minimise the difference between the experimental image and the theoretical model, following for example the so-called least squares method.

Generally speaking, the invention consists in obtaining the critical dimensions of the structure of the sample by means of an adjustment between an experimental image representative of the structure of the sample and a theoretical model, said theoretical model being calculated so as to take into account the artefacts present on the experimental images.

The aim of the invention is to obtain more efficiently and more precisely critical dimensions.

The signal measured at the position $P_i$ corresponds to the signal recorded in the pixel $P_i$ of the detector.

In addition, the invention consists in associating with the parametric approaches a temporal corrective term $S(P_i,t_i)$ that takes account of the transit time of the electron beam during the scanning of the surface of the sample. This comes down to taking into account the path of the primary electron beam. In other words, the temporal corrective term $S(P_i,t_i)$ makes explicit the notion of causality: the signal measured at the position $P_i$ at the instant $t_i$ depends on the path of the primary electron beam, that is to say the positions $P_j$ occupied at the instants t preceding the instant $t_i$.

The corrective term $S(P_i,t_i)$ is obtained by summing the signal originating from the excess charges present at the positions $P_j$ previously scanned by the primary electron beam. Each term of the sum includes a temporal dispersion function to take into account the charge dissipation and a spatial dispersion function to take into account the topography of the sample.

In other words, the corrective term $S(P_i,t_i)$ is obtained as a convolution product between the first parametric model and a given convolution kernel. The convolution product is calculated on the positions scanned by the primary electron beam before arriving at the position $P_i$ at the instant $t_i$.

Taking into account the positions scanned by the beam before arriving at the position $P_i$ makes it possible to introduce the notion of causality into the second theoretical model. Thanks to the given convolution kernel, which contains a temporal dispersion function and a spatial dispersion function, temporal charging effects are taken into account. The effect at the position $P_i$ of the charge deposited at the position $P_j$ depends on the distance between the two positions but also on the time that has gone by between the passage of the primary electron beam in $P_j$ and the passage in $P_i$.

For example, if the temporal difference between the instant $t_j$ at which the charge has been deposited at the position $P_j$ and the instant $t_i$ at which the beam is found at the position $P_i$ is much greater than the characteristic time of charge dissipation mechanisms, the second theoretical model does not take into account the effect of the charge at the position $P_j$.

The method according to the invention may also have one or more of the characteristics below, considered individually or according to all technically possible combinations thereof:

the second theoretical model is calculated according to the following formula:

$$U(P_i, t_i) = \left[\sum_{j=1}^{i} Q_j R_j \delta(P_i - P_j)\right] - S(P_i - t_i)$$

in which:

$U(P_i,t_i)$ is the second theoretical model calculated in correspondence with the position $P_i$ on the surface of the sample at the instant $t_i$;

the index $j \leq i$ scans the sequence of positions $P_j$ of the primary electron beam illuminated at the instants $t_j$, up to the position $P_i$ illuminated at the instant $t_i$, the primary electron beam being able to illuminate the same position at different instants;

$Q_j$ is the electric charge deposited by the primary electron beam when the beam illuminates the position $P_j$;

$R_j$ is the parametric mathematical function containing the parameters describing the topography of the sample and the charge creation efficiency at the position $P_j$;

$\delta(P_i-P_j)$ is a Kronecker delta, which is equal to one when $P_i = P_j$ and zero otherwise;

$\sum_{j=1}^{i} Q_j R_j \delta(P_i-P_j)$ is the first theoretical model of the signal measured at the position $P_i$ at the instant $t_i$ and takes into account the topography of the sample, the deposited electric charge, the charge efficiency and the multiple passages of the primary electron beam during scanning;

$S(P_i, t_i) = \sum_{j=1}^{i} \delta(P_i-P_j)[\sum_{k=1}^{j} C_k Q_k R_k F_S(P_j-P_k) F_t(t_j-t_k)]$ is the corrective term;

$F_S(P_i-P_j)$ is a spatial dispersion function taking into account the distance between the electric charge at the position $P_j$ and the position $P_i$;

$F_t(t_i-t_j)$ is a temporal dispersion function taking into account the temporal difference between the deposition of the electric charge at the position $P_j$ at the instant $t_j$ and the measurement of the signal at the position $P_i$ at the instant $t_i$;

$C_j$ is the effective charge accumulation coefficient at the position $P_j$.

the current of primary electrons is constant and equal to $Q_0$, the primary electron beam illuminates each position $P_j$ a single time and the second theoretical model is calculated according to the following formula:

$$U(P_i, t_i) = U_0(P_i, t_i) - Q_o \sum_{j=1}^{i} R_j C_j F_s(P_i - P_j) \cdot F_t(t_i - t_j)$$

in which $U_0(P_i, t_i) = Q_0 R_i$.

the response of the sample in the absence of topography is $R_0$ and the background intensity $U_b(P_i,t_i)$ due to the excess of charge is subtracted from the second theoretical model to eliminate the emission from the non-structured regions of the sample, the background intensity being calculated according to the following formula $$U(P_i, t_i) - U_b(P_i, t_i) = Q_0\left(R_i - R_0 - \sum_{j=1}^{i} (R_j C_j - R_0 C_0) F_s(P_i - P_j) \cdot F_t(t_i - t_j)\right)$$

In which $U_b(P_i, t_i) = Q_0 R_0 \left[1 - \sum_{j=1}^{i} C_j F_S(P_i - P_j) F_T(t_i - t_j)\right]$.

the primary electron beam scans the surface of the sample following the so-called TV or raster scan method, the scanning direction being the horizontal direction or x axis, the scanning speed $v_x$ being constant, the second theoretical model is calculated according to the following formula:

$$U(x) - U_b(x) \propto \left[R(x) - R_0 - \int_0^x (C(x')R(x') - C_0 R_0) v_x F(x - x') dx'\right]$$

in which:

x is the spatial coordinate in the scanning direction of the primary electron beam;

$U_b(x)$ is the background intensity at the position x;

$Q_0(x)$ is the charge deposited by the primary electron beam in correspondence with the position x;

$$F(x - x') = F_S(x - x') F_t\left(\frac{x - x'}{v_x}\right)$$

contains the spatial dispersion function and the temporal dispersion function expressed as a function of the coordinate x, the scanning speed $v_x$ being constant.

the temporal dispersion function is an exponential function with time constant $\tau$:

$$F_t(t) = e^{-\frac{t}{\tau}}$$

the temporal dispersion function is a Cauchy type distribution function:

$$F_t(t) = \frac{1}{1 + \left(\frac{t}{\tau}\right)^2}$$

the spatial dispersion function is of the form:

$$F_s(r) = e^{-\frac{\|r\|^2}{2\sigma^2}}$$

The invention also relates to a method for calibrating a CD-SEM characterisation technique, said calibration comprising the following steps:

producing an experimental image representative of the structure of a reference sample of which the geometric dimensions are known, said image being derived from a scanning electron microscope from a first theoretical model based on parametric mathematical functions, calculating a second theoretical model obtained by algebraic summation of a corrective term, said second theoretical model comprising a set of parameters, said set of parameters including both the known parameters which describe the geometric structure of the reference sample and the parameters to be determined which describe the instrumental response;

determining the parameters present in the second theoretical model and describing the instrumental response by means of an adjustment between said second theoretical model and said experimental image representative of the structure of the reference sample.

The invention also relates to the implementation of a calibrated CD-SEM technique, said method comprising the following steps:

producing an experimental image representative of the structure of the sample and coming from a scanning electron microscope;

from a first theoretical model based on parametric mathematical functions, calculating a second theoretical model obtained by algebraic summation of a corrective term, said second theoretical model comprising a set of parameters, said set of parameters including both the parameters to be determined which describe the geometric structure of the sample of interest and the parameters determined according to the calibration described above which describe the instrumental response;

determining the parameters present in the second theoretical model and describing the structure of the sample of interest by means of an adjustment between said second theoretical model and said experimental image.

LIST OF FIGURES

Other characteristics and advantages of the invention will become clear from the description that is given thereof below, for indicative purposes and in no way limiting, with reference to the appended figures, among which:

FIG. 1 schematically illustrates an intensity profile of secondary electrons as a function of the profile of a pattern obtained via a CD-SEM type instrumentation;

FIGS. 2a and 2b illustrate an example of parametric mathematical modelling of a CS-SEM image;

DETAILED DESCRIPTION

Figure 3A:
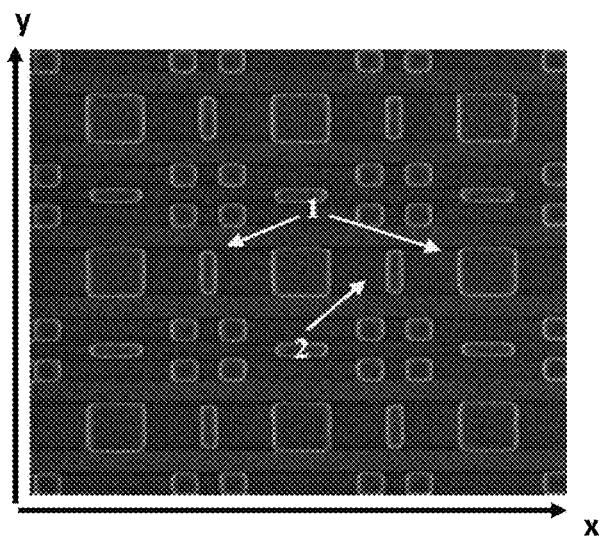
FIGS. 3a, 3b, 3c and 3d illustrate examples of dark mark type artefacts observed on experimental CD-SEM images.
Figure 3B:
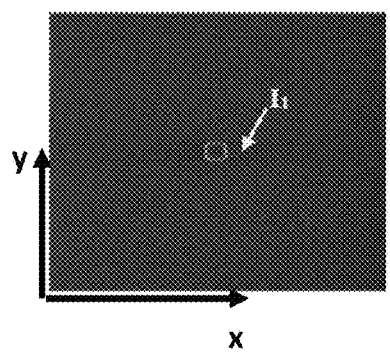
Figure 3C:
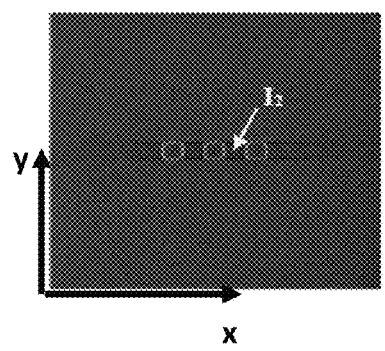
Figure 3D:
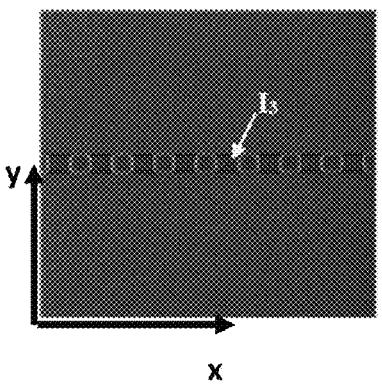
Figure 4:
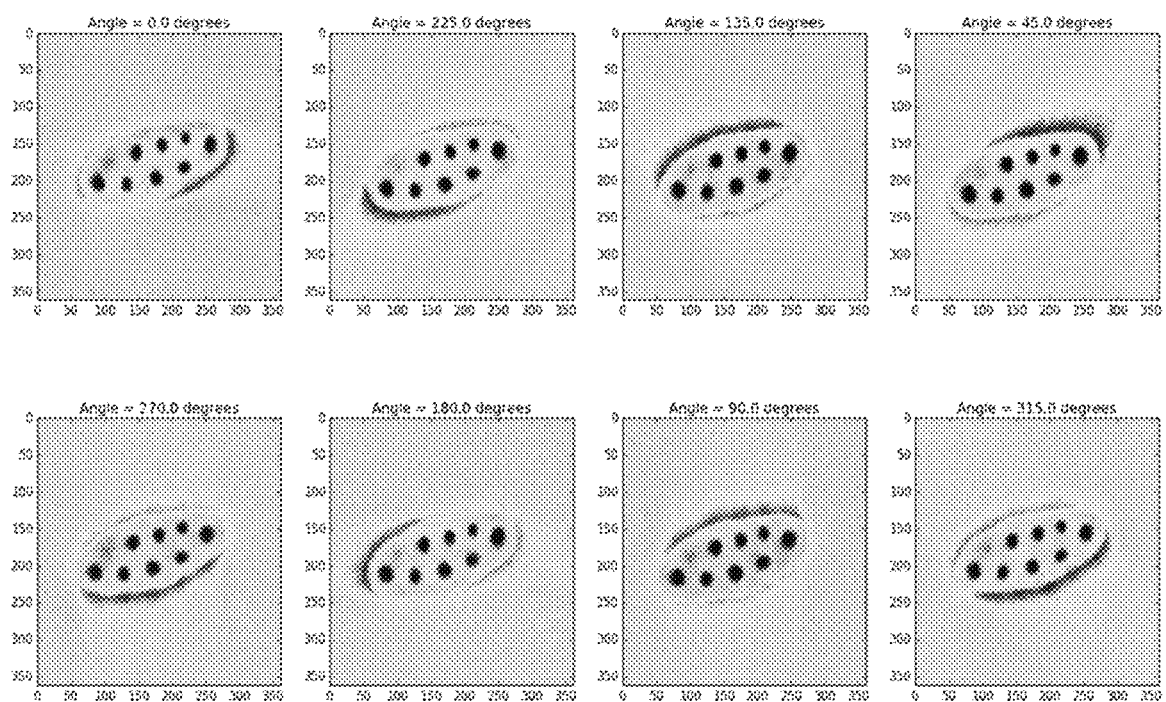
FIG. 4 shows several CD-SEM images acquired on the same sample but with a different scanning angle.

FIG. 4 shows a series of CD-SEM images taken on a same sample. Each image has been acquired by scanning the surface of the sample according to a different angle. It is obvious that by varying the scanning angle, the images obtained change. This clearly shows that the path of the beam has an influence on the image formation process: the signal measured at a given position on the sample changes according to the path followed by the primary electron beam.

These observations may be explained by evoking the charging effects described above, including temporal effects.

It appears necessary to model the signal measured at a given position on the surface of the sample while taking into account the positions scanned by the primary electron beam before arriving at the given position.

When the incident beam of primary electrons is advancing at the point r on the sample, secondary electrons are generated with an efficiency $\rho(r)$. This efficiency is linked to the nature of the materials present at the point r but also in its vicinity and the geometry of the structure considered.

In addition, the primary electron beam is not punctiform but has a spatial distribution of incident current density. The actual efficiency when the beam is centred on the point P is:

$$R(P)=\iint\rho(r)\times f(r-P)dr$$

Where f(r) is the normalised spatial distribution of electrons. This distribution function follows a decreasing law, for example composed of Gaussian functions. Hereafter it is considered that the contribution to the point P is the spatially integrated contribution of the response on the spatial extension of the beam.

The instantaneous response at the point P is thus a result of several complex factors. When backscattered and secondary electrons are generated, they create a distribution of charges leading to the generation of an electrostatic field that is going to modify the signal detected during the displacement of the incident beam. These generated fields generally decrease if discharging processes exist (external electrostatic fields, dissipation of charges by the sample, etc.). However, this discharging time is often longer than the characteristic time between two measurement points of the microscope, which perturbs the formation of the image.

The present invention models the effect of these charges using a corrective term S.

The charge creation efficiency is proportional to R(r) and is a function of the illuminated material and its geometry (and thus of the position). The immediate effect in r at time t on the signal is called $T(r,t)=I(t)R(r)C(r)$. With C(r) reflecting an effective charge coefficient, where I(t) is the current when the incident beam is in r.

The effect of the charges is dispersed spatially with a distribution function $F_s(r)$. This distribution is maximum in r=0 and decreases with the distance r.

The effect of the charges decreases over time since it may be assumed that charge dissipation processes exist that have a characteristic time constant $\tau$. $F_t(t)$ will be taken.

It is generally considered that the incident beam follows a sequence of positions $r_p$ as a function of time $t_p$, where p is a position index.

The model takes into account the fact that several times may exist such that $P(t)=P(t')$ with $t \neq t'$. The scanning may thus comprise redundant points, which happens notably when the images are accumulated over several passages (frames).

Figure 5:
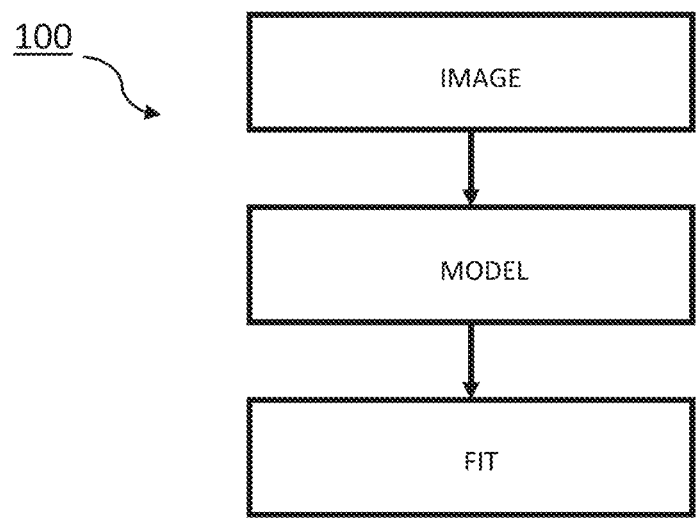
FIG. 5 represents the different steps of the method according to the invention.

FIG. 5 illustrates the different steps of the method 100 according to the invention.

The first step IMAGE of the method 100 according to the invention includes the acquisition of an experimental image representative of the surface of the sample and derived from a scanning electron microscope.

This step includes for example the scanning of the portion of sample of interest with the primary electron beam and the formation of an image obtained by measuring the emitted secondary electrons.

The second step MODEL of the method 100 according to the invention includes the modelling of the measured signal using a second theoretical model $U(P_i,t_i)$ obtained from a first parametric model by summation of a corrective term $S(P_i, t_i)$. The model $U(P_i,t_i)$ gives the intensity of the signal of secondary electrons at the position $P_i$ at the instant $t_i$.

The first theoretical model is constructed from parametric mathematical functions and contains a set of parameters describing the structure of the sample as well as the instrumental response. It may be considered that the first theoretical model takes into account the topography of the sample, the deposited electric charge, the charge efficiency and the multiple passages of the primary electron beam during scanning.

The corrective term takes into account the excess charges deposited by the primary electron beam during scanning. This corrective term is constructed by summing the contributions coming from the charges deposited at each position during scanning of the primary electron beam. The corrective term includes a spatial dispersion function to take into account the topography of the sample. The corrective term also includes a temporal dispersion function to take into account charge dissipation phenomena. The corrective term takes into account potential multiple passages of the primary electron beam.

The third step FIT of the method 100 according to the invention includes the adjustment of the model $U(P_i, t_i)$ on the experimental image acquired at the first step. The adjustment step makes it possible to find the values of the parameters describing the geometry of the sample after having taken into account artefacts linked for example to charging effects.

The corrective term may be written at point $P_i$ at the instant $t_i$ as:

$$S(P_i, t_i) = \sum_{j=1}^{i} \delta(P_i - P_j) \left[ \sum_{k=1}^{j} C_k Q_k R_k F_S(P_j - P_k) F_t(t_j - t_k) \right]$$

The index $j \leq i$ scans the sequence of positions $P_j$ of the primary electron beam illuminated at the instants $t_j$, up to the position $P_i$ illuminated at the instant $t_i$, the primary electron beam being able to illuminate the same position at different instants.

The summation on the index j relative to the Kronecker delta function takes into account the possibility of several passages of the primary electron beam at the point $P_i$ illuminated at the instant $t_i$.

The summation on the index k makes it possible to calculate the corrective term for each passage of the primary electron beam at the position $P_j$. This summation takes into account the points $P_k$ scanned by the primary electron beam at the instants $t_k$ preceding the instant $t_j$.

$Q_k$ is the charge deposited when the beam is at the position $P_k$. This charge is a function of the current but also of the time during which it may be considered that the beam is at the position $P_k$, that is to say the scanning speed. The quantity $R_k$ also appears in the first theoretical model of the surface of the sample and contains the parameters describing the geometry of the sample as well as the parameters describing the instrumental response and the charge creation efficiency.

The parameter $C_k$ is an effective charge coefficient.

The function $F_s(r-P_k)$ is a spatial dispersion function and the function $F_t(t-t_k)$ is a temporal dispersion function.

When charging phenomena are neglected, the signal measured during the sequence is:

$$U(P_i, t_i) = \sum_{j=1}^{i} Q_j R_j \delta(P_i - P_j)$$

The signal measured is a summation of all the positions scanned by the primary electron beam. The Kronecker delta $\delta(P_i - P_j)$ is equal to one when $P_i = P_j$ and zero otherwise. Indeed, when the beam illuminates the position $P_i$, the signal is recorded in the pixel $P_i$ of the detector. If the beam passes again on the same point, the signal will be integrated (added to the preceding signal). The detector thus has a memory.

According to an embodiment, the second theoretical model is obtained according to the following formula:

$$U(P_i, t_i) = \left[ \sum_{j=1}^{i} Q_j R_j \times \delta(P_i - P_j) \right] - S(P_i, t_i)$$

The minus sign in front of the corrective term S arises from the fact that the charging often results in darker zones on the CD-SEM images, i.e. an attenuation of the signal without charging. In some cases however, the impact of charging may on the contrary be positive, according to the sign of the effective charge coefficient.

An benefit of this embodiment is to take into account the effects of both spatial and temporal charging. In addition, this embodiment takes into account the fact that the primary electron beam can pass several times by the same position.

The second theoretical model may thus take the following form:

$$U(P_i, t_i) = \sum_{j=1}^{i} \delta(P_i - P_j) \left[ Q_j R_j - \sum_{k=1}^{j} Q_k R_k C_k F_s(P_j - P_k) \cdot F_t(t_j - t_k) \right]$$

The dispersion function $F_t(t_j - t_k)$ takes into account the charge dissipation phenomena which cause a decrease in the excess charges deposited during the passage of the primary electron beam.

According to an embodiment, the temporal dispersion function takes the form:

$$F_t(t) = e^{-\frac{t}{\tau}}$$

where $\tau$ is the characteristic charge dissipation time.

According to another embodiment, slower decreases may be taken into account using a Cauchy type distribution function:

$$F_t(t) = \frac{1}{1 + \left(\frac{t}{\tau}\right)^2}$$

The spatial dispersion function makes it possible to take into account the distance between the position $P_i$ at which the second theoretical model is calculated and the charge $Q_j$ at the position $P_j$.

According to an embodiment, the spatial dispersion function may have a Gaussian type bell shape:

$$F_s(r) = e^{-\frac{\|r\|^2}{2\sigma^2}}$$

Other spatial distribution functions may be used, according to the surface scanning mode chosen, for example. Asymmetric spatial distribution functions may also be chosen.

In most CD-SEM images two simplifying hypotheses may be applied. The first hypothesis is that the current of primary electrons is constant during scanning and equal to $Q_0$. The second hypothesis is that the surface of the sample is scanned once, without multiple passages of the primary electron beam. The second hypothesis corresponds to the absence of redundant points: the condition $P(t)=P(t')$ with $t \neq t'$ is never verified.

The second theoretical model may then be calculated according to the following formula:

$$U(P_i, t_i) = U_0(P_i, t_i) - Q_o \sum_{j=1}^{i} R_j C_j F_s(P_i - P_j) \cdot F_t(t_i - t_j)$$

in which $U_0(P_i, t_i) = Q_0 R_i$ is the signal obtained at the position $P_i$ at the instant $t_i$ without taking into account charging effects.

One benefit of this embodiment is to obtain a formula that is simpler to implement in the course of step FIT of the method according to the invention.

On account of charging effects, a CD-SEM image acquired on a sample without topography and with a single material is not flat but will have an intensity $U_b(P_i, t_i)$ given by the following formula:

$$U_b(P_i, t_i) = Q_0 R_0 \times \left[ 1 - \sum_{j=1}^{i} C_j F_s(P_i - P_j) \cdot F_t(t_i - t_j) \right]_o$$

Where $R_0$ is the response of the substrate. If this term is subtracted from the image calculated according to the second theoretical model, this gives:

$$U(P_i, t_i) - U_b(P_i, t_i) \propto$$

$$\left( R_i - R_0 - \sum_{j=1}^{i} (R_j C_j - R_0 C_0) F_s(P_i - P_j) \cdot F_t(t_i - t_j) \right)$$

If the charging phenomena are homogenous at the surface of the sample, it is possible to consider that the effective charge parameter has the same value at any point of the surface of the sample $c_i \approx c_0$ and this gives:

$$U(P_i, t_i) - U_b(P_i, t_i) \propto \Delta_i - C_0 \sum_{j=1}^{i} \Delta_i F_s(P_i - P_j) \cdot F_t(t_i - t_j)$$

Where $\Delta_i = R_i - R_0$.

A benefit of this embodiment is to obtain a modelling in which the background has a zero response and that only the contrasted parts, that is to say giving rise to $R_p - R_0 \neq 0$, induce the charging phenomenon.

A benefit of this embodiment is that the background may be subtracted by image processing and the calculation of the charging is only performed on the structured parts of the sample.

Figure 6:
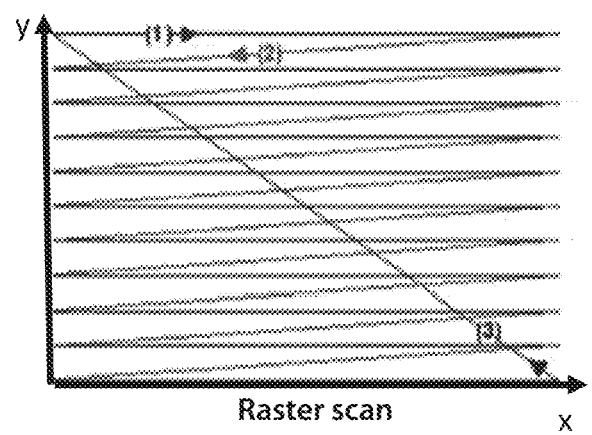
FIG. 6 illustrates the so-called TV or raster scan method.

The scanning of the surface of the sample for the acquisition of a CD-SEM image may be carried out according to several methods. An often used technique is the so-called raster scan technique, also called TV scan technique, illustrated in FIG. 6. According to this scanning mode, it is possible to identify a rapid scanning direction along the direction x indicated in FIG. 6 and a slow scanning direction along the direction y indicated in FIG. 6. According to this scanning method, data acquisition takes place only in correspondence with the horizontal lines, indicated (1) in FIG. 6. Hereafter, the rapid scanning direction, x in FIG. 6, will refer to the scanning direction of the primary electron beam.

When this scanning method is used, each line of the image is scanned at constant speed and this gives:

$$t_i - t_j = \frac{x_i - x_j}{v_x}$$

This comes down to writing the second theoretical model according to the following formula:

$$U(x_i, t_i) = Q_i R_i - \sum_{j=1}^{i} Q_j R_j \cdot C_j F_s(x_i - x_j) \cdot F_t\left( \frac{x_i - x_j}{v_x} \right)$$

If the multiple passages of the primary electron beam are excluded, the calculation of the second theoretical model comes down to:

$$U(x_i, t_i) = Q_i R_i - \sum_{j=1}^{i} Q_j R_j \cdot C_j F(x_i - x_j)$$

Where $$F(x) = F_s(x) \cdot F_t\left( \frac{x}{v_x} \right).$$

This formula corresponds to a corrective term of truncated convolution product type with the instantaneous response T.

In other words, the corrective term is a convolution product between the first parametric model and a given convolution kernel. The convolution product is calculated on the positions scanned by the primary electron beam before arriving at the position $P_i$ at the instant $t_i$ and makes it possible to take into account the charges deposited by the beam.

The second theoretical model may also be calculated in continuous variables using the following formula:

$$U(x) - U_0(x) \propto R(x) - R_0 - \int_0^x v_x dx' \times [C(x')R(x') - C_0 R_0] F(x - x')$$

A benefit of this embodiment is the simplification of the calculation steps, the integration being performed exclusively on a single spatial variable.

The invention also relates to the implementation of a calibration step of a CD-SEM technique. This calibration step is carried out in order to determine the parameters present in the model and linked to the instrumental response.

These parameters form part of the set of parameters already present in the first theoretical model and they take into account, for example, the fact that the primary electron beam has a non-zero size. Often the shape of the primary electron beam is described as a Gaussian profile. This Gaussian function taking into account the characteristics of the primary electron beam is called point spread function or PSF. The parameters describing the instrumental response, for example the parameters of the PSF, may advantageously be determined during a preliminary calibration step. The calibration is obtained by carrying out an adjustment between the second theoretical model and the experimental image of a sample of which the structure is known. This makes it possible to fix the geometric parameters during the calibration step and to obtain in a more reliable manner the parameters describing the instrumental response. The values of the parameters describing the instrumental response will next be fixed during the implementation of the CD-SEM technique for the characterisation of an experimental image of interest.

An advantage of carrying out the calibration step is to be able to determine in a more precise and reliable manner the parameters describing the instrumental response. Next, these parameters describing the instrumental response will be fixed during the implementation of the CD-SEM technique for the characterisation of an experimental image of interest, which makes it possible to attain a more precise and reliable determination of the parameters describing the structure of the sample and thus the critical dimensions of interest.

The invention also relates to a method for implementing a CD-SEM characterisation technique comprising the following steps:
  producing an experimental image representative of the structure of the sample and derived from a scanning electron microscope;
  from a first theoretical model based on parametric mathematical functions, calculating a second theoretical model obtained by algebraic summation of a corrective term, said second theoretical model comprising a set of parameters, said set of parameters including both the parameters to determine which describe the geometric structure of the sample of interest and the parameters determined according to the above calibration which describe the instrumental response;
  determining the parameters present in the second theoretical model and describing the structure of the sample of interest by means of an adjustment between said second theoretical model and said experimental image.

Beneficially, this method for implementing a CD-SEM characterisation technique is particularly efficient. Thanks to this method, it is possible to produce a CS-SEM image of a sample of interest and to measure at least one critical dimension of said sample while taking into account the instrumental response and charging effects.

The invention claimed is:

1. A method for implementing a scanning electron microscopy characterisation technique for the determination of at least one critical dimension of a structure of a sample in the field of dimensional metrology, known as CD-SEM technique, said method comprising:
  producing an experimental image representative of the structure of the sample and derived from a scanning electron microscope;
  from a first theoretical model based on parametric mathematical functions, calculating a second theoretical model $U(P_i,t_i)$ describing a signal measured at the position $P_i$ at the instant $t_i$, said second model $U(P_i,t_i)$ being obtained by algebraic summation of a corrective term $S(P_i,t_i)$, said second theoretical model comprising a set of parameters to be determined;
  determining the set of parameters present in the second theoretical model by means of an adjustment between said second theoretical model and said experimental image;
wherein said corrective term $S(P_i,t_i)$ is calculated by summing a signal originating from electric charges deposited by a primary electron beam at a plurality of instants t less than or equal to $t_i$.

2. The method according to claim 1, wherein the second theoretical model is calculated according to the following formula:

$$U(P_i, t_i) = \left[\sum_{j=1}^{i} Q_j R_j \delta(P_i - P_j)\right] - S(P_i, t_i)$$

in which:
  $U(P_i,t_i)$ is the second theoretical model calculated in correspondence with the position $P_i$ on the surface of the sample at the instant $t_i$;
  the index $j \leq i$ scans the sequence of positions $P_j$ of the primary electron beam illuminated at the instants $t_j$, up to the position $P_i$ illuminated at the instant $t_i$, the primary electron beam being able to illuminate the same position at different instants;
  $Q_j$ is the electric charge deposited by the primary electron beam when the beam illuminates the position $P_j$;
  $R_j$ is the parametric mathematical function containing the parameters describing the topography of the sample and the charge creation efficiency at the position $P_j$;
  $\delta(P_i-P_j)$ is a Kronecker delta, which is equal to one when $P_i=P_j$ and zero otherwise;
  $\sum_{j=1}^{i} Q_j R_j \delta(P_i-P_j)$ is the first theoretical model of the signal measured at the position $P_i$ at the instant $t_i$ and takes into account the topography of the sample, the deposited electric charge, the charge efficiency and the multiple passages of the primary electron beam during scanning;
  $S(P_i,t_i)=\sum_{j=1}^{i}\delta(P_i-P_j)[\sum_{k=1}^{i}C_k Q_k R_k F_s(P_j-P_k)F_t(t_j-t_k)]$ is the corrective term;
  $F_s(P_i-P_j)$ is a spatial dispersion function taking into account the distance between the electric charge at the position $P_j$ and the position $P_i$;
  $F_t(t_i-t_j)$ is a temporal dispersion function taking into account the temporal difference between the deposition of the electric charge at the position $P_j$ at the instant $t_j$ and the measurement of the signal at the position $P_i$ at the instant $t_i$;
  $C_j$ is the effective charge accumulation coefficient at the position $P_j$.

3. The method according to claim 2, wherein the current of primary electrons is constant and equal to $Q_0$, the primary electron beam illuminates each position $P_j$ a single time and the second theoretical model is calculated according to the following formula:

$$U(P_i, t_i) = U_0(P_i, t_i) - Q_0 \sum_{j=1}^{i} R_j C_j F_s(P_i - P_j) \cdot F_t(t_i - t_j)$$

in which $u_0(P_i,t_i)=Q_0 R_i$.

4. The method according to claim 3, wherein the response of the sample in the absence of topography is $R_0$ and the background intensity $U_b(P_i,t_i)$ due to the excess of charge is subtracted from the second theoretical model to eliminate the emission from non-structured regions of the sample, the background intensity being calculated according to the following formula $$U(P_i, t_i) - U_b(P_i, t_i) \propto \left( R_i - R_0 - \sum_{j=1}^{i} (R_j C_j - R_0 C_0) F_s(P_i - P_j) \cdot F_t(t_i - t_j) \right)$$

In which $U_b(P_i, t_i) = Q_0 R_0 \left[ 1 - \sum_{j=1}^{i} C_j F_S(P_i - P_j) F_T(t_i - t_j) \right].$ 5. The method according to claim 2, wherein the temporal dispersion function is an exponential function with time constant $\tau$:

$$F_t(t) = e^{-\frac{t}{\tau}}$$

6. The method according to claim 2, wherein the temporal dispersion function is a Cauchy type distribution function:

$$F_t(t) = \frac{1}{1 + \left(\frac{t}{\tau}\right)^2}$$

7. The method according to claim 2, wherein the spatial dispersion function is of the form:

$$F_s(r) = e^{-\frac{\|r\|^2}{2\sigma^2}}$$

8. The method according to claim 1, wherein the primary electron beam scans the surface of the sample according to the TV or raster scan method, the scanning direction being the horizontal direction or x axis, the scanning speed $v_x$ being constant.

9. The method according to claim 8, wherein the second theoretical model is calculated according to the following formula:

$$U(x) - U_b(x) \propto \left[ R(x) - R_0 - \int_0^x (C(x')R(x') - C_0 R_0) v_x F(x - x') dx' \right]$$

in which:
x is the spatial coordinate in the scanning direction of the primary electron beam;
$U_b(x)$ is the background intensity at the position x;
$Q_0(x)$ is the charge deposited by the primary electron beam in correspondence with the position x;

$$F(x - x') = F_S(x - x') F_t\left(\frac{x - x'}{v_x}\right)$$

contains the spatial dispersion function and the temporal dispersion function expressed as a function of the coordinate x, the scanning speed $v_x$ being constant.

10. The method according to claim 1, said method being implemented for a calibration of the CD-SEM characterisation technique, said calibration comprising:
producing an experimental image representative of a structure of a reference sample of which the geometric dimensions are known, said image being derived from a scanning electron microscope;
from a first theoretical model based on parametric mathematical functions, calculating a second theoretical model obtained by algebraic summation of a corrective term, said second theoretical model comprising a set of parameters, said set of parameters including both the known parameters which describe the geometric structure of the reference sample and the parameters to be determined which describe an instrumental response;
determining the parameters present in the second theoretical model and describing the instrumental response by means of an adjustment between said second theoretical model and said experimental image representative of the structure of the reference sample.

11. The method for implementing a CD-SEM characterisation technique according to claim 1, wherein said method comprising:
producing an experimental image representative of the structure of the sample and derived from a scanning electron microscope;
from a first theoretical model based on parametric mathematical functions, calculating a second theoretical model obtained by algebraic summation of a corrective term, said second theoretical model comprising a set of parameters, said set of parameters including both the parameters to be determined which describe the geometric structure of the sample of interest and the parameters determined according to a calibration which describe an instrumental response;
determining the parameters present in the second theoretical model and describing the structure of the sample of interest by means of an adjustment between said second theoretical model and said experimental image.

* * * * *

UNITED STATES PATENT AND TRADEMARK OFFICE
CERTIFICATE OF CORRECTION

PATENT NO. : 10,921,269 B2
APPLICATION NO. : 16/469956
DATED : February 16, 2021
INVENTOR(S) : Patrick Quemere et al.

Page 1 of 1

It is certified that error appears in the above-identified patent and that said Letters Patent is hereby corrected as shown below:

In the Claims

Please amend Claim 2, Column 16, Line 44 to appear as follows:

$$S(P_i, t_i) = \sum_{j=1}^{i} \delta(P_i - P_j) \left[ \sum_{k=1}^{j} C_k Q_k R_k F_s(P_j - P_k) F_t(t_j - t_k) \right]$$

Signed and Sealed this
Tenth Day of August, 2021

Drew Hirshfeld
*Performing the Functions and Duties of the*
*Under Secretary of Commerce for Intellectual Property and*
*Director of the United States Patent and Trademark Office*